US011796921B2

(12) United States Patent
Donkerbroek et al.

(10) Patent No.: US 11,796,921 B2
(45) Date of Patent: Oct. 24, 2023

(54) METHOD AND LITHOGRAPH APPARATUS FOR MEASURING A RADIATION BEAM

(71) Applicant: ASML NETHERLANDS B.V., Veldhoven (NL)

(72) Inventors: Arend Johannes Donkerbroek, Aarle-Rixtel (NL); Yassin Chowdhury, Geldrop (NL); Maurice Henricus Franciscus Janssen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 63 days.

(21) Appl. No.: 17/427,412

(22) PCT Filed: Jan. 30, 2020

(86) PCT No.: PCT/EP2020/052250
§ 371 (c)(1),
(2) Date: Jul. 30, 2021

(87) PCT Pub. No.: WO2020/164918
PCT Pub. Date: Aug. 20, 2020

(65) Prior Publication Data
US 2022/0100102 A1 Mar. 31, 2022

(30) Foreign Application Priority Data
Feb. 13, 2019 (EP) .................... 19156895

(51) Int. Cl.
*G03F 7/20* (2006.01)
*G03F 7/00* (2006.01)
(52) U.S. Cl.
CPC ........ *G03F 7/7055* (2013.01); *G03F 7/70591* (2013.01)

(58) Field of Classification Search
CPC .. G03F 7/7055; G03F 7/70591; G03F 7/7085; G03F 7/706; G03F 7/70566
See application file for complete search history.

(56) References Cited

U.S. PATENT DOCUMENTS

2007/0242256 A1   10/2007   Van De Kerkhof

FOREIGN PATENT DOCUMENTS

| DE | 102014209348 | 11/2015 |
| JP | 2005116810 | 4/2005 |
| WO | 2017186458 | 11/2017 |

OTHER PUBLICATIONS

International Search Report and Written Opinion issued in corresponding PCT Patent Application No. PCT/EP2020/052250, dated Jun. 2, 2020.

*Primary Examiner* — Mesfin T Asfaw
(74) *Attorney, Agent, or Firm* — Pillsbury Winthrop Shaw Pittman, LLP

(57) ABSTRACT

A lithographic apparatus including a projection system having an optical axis and configured to project a radiation beam. The apparatus includes a measurement unit arranged to measure the radiation beam projected by the projection system, the measurement unit having an opening through which the radiation beam passes in use, and a sensing surface extending transverse to the optical axis and arranged to measure the radiation beam passing through the opening. The apparatus is configured to move the sensing surface in a plane transverse to the optical axis between a plurality of measurement positions. The radiation beam defines a view in the plane, and the measurement unit is configured such that the sensing surface captures, in each measurement position, a portion of the view smaller than 100% of the view.

20 Claims, 6 Drawing Sheets

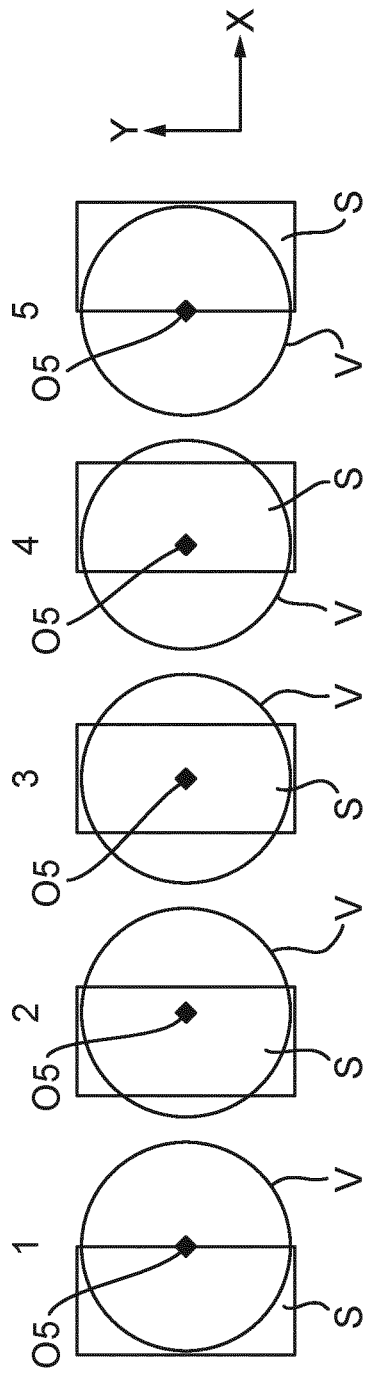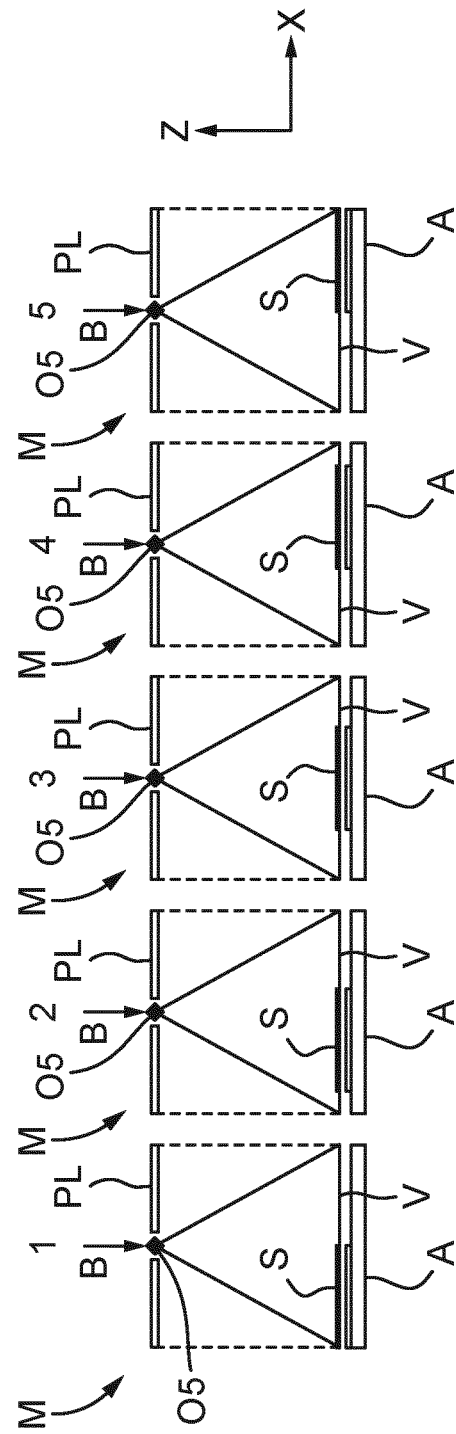

METHOD AND LITHOGRAPH APPARATUS FOR MEASURING A RADIATION BEAM

CROSS-REFERENCE TO RELATED APPLICATIONS

This application is the U.S. national phase entry of PCT Patent Application No. PCT/EP2020/052250 which was filed on Jan. 30, 2020, which claims the benefit of priority of European Patent Application No. 19156895.5 which was filed on Feb. 13, 2019 and which is incorporated herein in its entirety by reference.

FIELD

The present invention relates to a method and lithographic apparatus for measuring a radiation beam.

BACKGROUND

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system. A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Lithography includes a projection of patterns onto a substrate with high accuracy. In order to ensure that projection is achieved with high accuracy, various calibration measurements are made within the apparatus. In some instances, adjustments of the apparatus are made in response to these measurements.

Known image sensors may be used to measure lens aberration and intensity distribution in a pupil plane of the illuminator. Such sensors may consist of a top plate that transmits light through a grating or pinhole coming from the projection lens and a sensor placed at a conjugate pupil plane to record the spot of light. The resolution of the light that can be measured depends on the angular resolution of the sensor. The resolution is limited by the number of pixels and available space for the sensor.

As advancements are made in the development of lithographic tools, the requirements for projection optics have increased such that tighter aberration control is needed to enable better imaging. To provide improved correction techniques, a high spatial resolution wave front measurement may be needed to match the necessary resolution to provide advanced high resolution lithographic tools. Such high spatial resolution wave front measurements may be particularly beneficial for measuring the illumination pupil during the set-up of the lithographic apparatus.

The resolution available for such sensors may be limited for a variety of reasons, but in particular, due to the number of pixels of the sensor and available space for the sensor. As a higher resolution is preferable, either smaller pixels are needed or the spot size should be increased by placing the detector further away from markers used in a sensor. However, both solutions have their limitations. If the pixel size it too small, there may be crosstalk between pixels, which deteriorates the quality of measurements from the sensor. There are also geometrical limitations on the space available for such types of sensors and it may not be possible to increase the distance between the sensor and the marker. Furthermore, the types of sensor used tend to be commercially available (i.e. off-the-shelf detectors). Therefore, there are advantages to providing a solution which uses sensor technology which is already available, or even already used, in a more advantageous manner.

SUMMARY

In the present invention, there is provided a lithographic apparatus comprising: a projection system having an optical axis and configured to project a radiation beam; and a measurement unit arranged to measure the radiation beam projected by the projection system, the measurement unit comprising: an opening through which the radiation beam passes in use; and a sensing surface extending transverse to the optical axis and arranged to measure the radiation beam passing through the opening, wherein the lithographic apparatus is configured to move the sensing surface in a plane transverse to the optical axis between a plurality of measurement positions, wherein the radiation beam defines a view in said plane, and wherein the measurement unit is configured such that the sensing surface captures, in each measurement position, a portion of the view smaller than 100% of the view.

According to the present invention, there is also provided a method of measuring a radiation beam in a lithographic apparatus, the method comprising: providing a radiation beam; projecting the radiation beam, through an opening in a measurement system, using a projection system having an optical axis; and measuring the radiation beam having passed through the opening, at a plurality of measurement positions, using a sensing surface of the measurement system, the sensing surface extending transverse to the optical axis; wherein measuring the radiation beam comprises moving the sensing surface in a plane transverse to the optical axis between the plurality of measurement positions, wherein the radiation beam defines a view in said plane, and wherein the sensing surface captures, in each measurement position, a portion of the view smaller than 100% of the view.

Further embodiments, features and advantages to the present inventions, as well the structure and operation of the various embodiments of the present invention, are described in detail below with reference to the accompanying drawings.

BRIEF DESCRIPTION OF THE DRAWINGS

The accompanying drawings, which are incorporated herein and form part of the specification, illustrate one or more embodiments of the present invention and, together with the description, further serve to explain the principals of the invention and to enable a person skilled in the pertinent art to make and use the invention.

FIGS. 4A and 4B schematically depict an apparatus of an embodiment.

One or more embodiments of the present invention will now be described with reference to the accompanying drawings. In the drawings, like reference numbers can indicate identical or functionally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
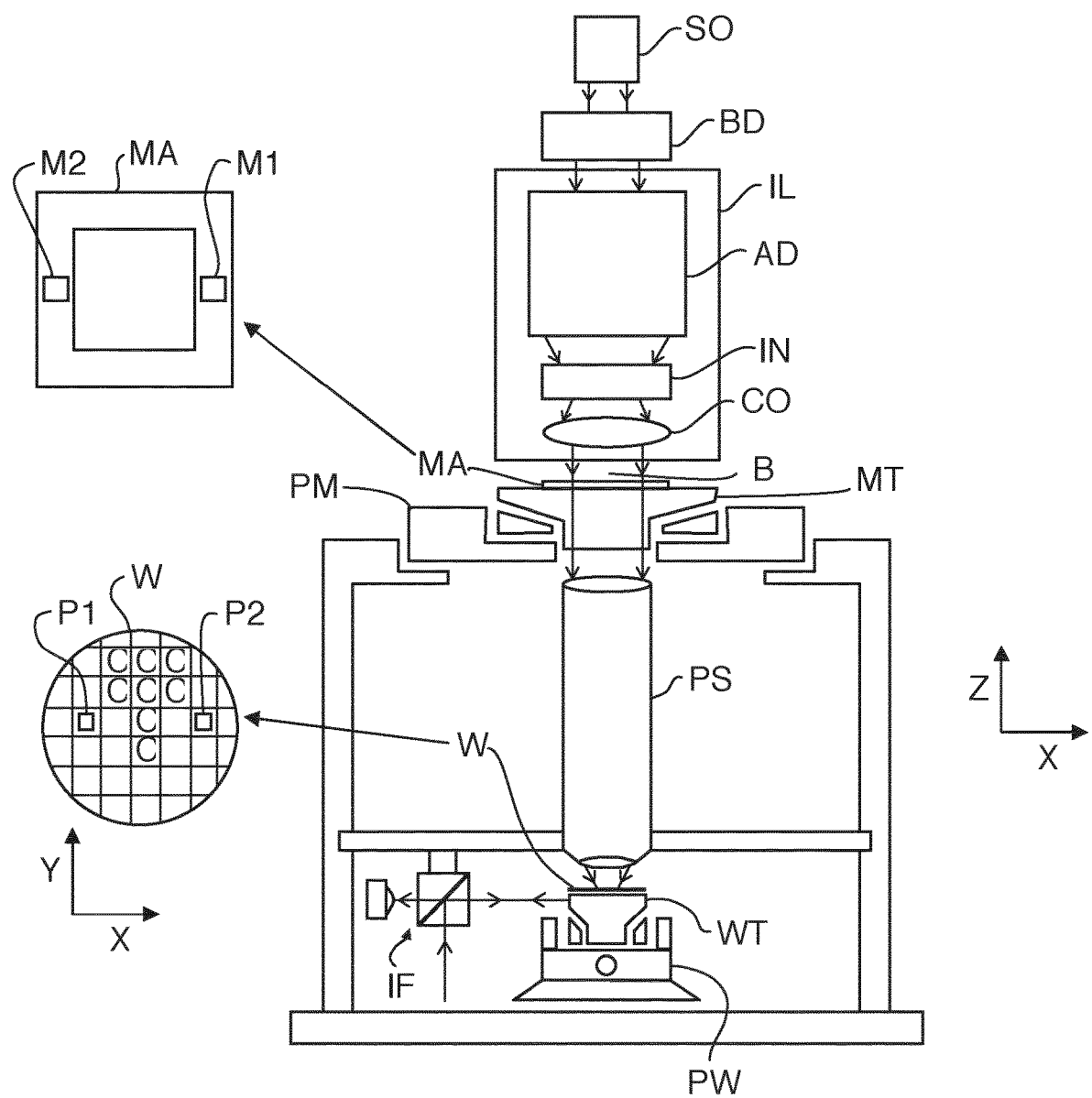
FIG. 1 schematically depicts a lithographic apparatus.

FIG. 1 schematically depicts a lithographic apparatus. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The lithographic apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The substrate support may comprise a substrate table WT (otherwise referred to as a chuck) on which a substrate holder is supported. The substrate holder may be configured to support the substrate W. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, to direct, shape, or control radiation.

The patterning device support holds the patterning device MA in a manner that depends on the orientation of the patterning device MA, the design of the lithographic apparatus, and other conditions, such as for example whether or not the patterning device MA is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device MA is at a desired position, for example with respect to the projection system PS. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam B may not exactly correspond to the desired pattern in the target portion of the substrate W, for example if the pattern includes phase-shifting features or so called assist features. Generally, the pattern imparted to the radiation beam B will correspond to a particular functional layer in a device being created in the target portion, such as an integrated circuit.

The patterning device MA may be transmissive or reflective. Examples of patterning devices MA include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device (e.g. mask) MA and the projection system PS. Immersion techniques can be used to increase the numerical aperture of projection systems. The term "immersion" as used herein does not mean that a structure, such as a substrate, must be submerged in liquid, but rather only means that a liquid is located between the projection system PS and the substrate W during exposure.

Referring to FIG. 1, the illuminator IL receives a radiation beam B from a radiation source SO. The source and the lithographic apparatus may be separate entities, for example when the source is an excimer laser. In such cases, the source is not considered to form part of the lithographic apparatus and the radiation beam B is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam B, to have a desired uniformity and intensity distribution in its cross-section.

The radiation beam B is incident on the patterning device (e.g., mask) MA, which is held on the mask support structure (e.g., mask table) MT, and is patterned by the patterning device MA. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam B is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam B is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As described above, measurements may be taken to reduce errors in the radiation beam B which is incident on the substrate W. Known sensors may be used to carry out calibration measurements of the radiation beam B projected by the projection system PS. One such calibration measurement that is performed in a lithography apparatus is a measurement of the aberration present in the radiation beam projected by the projection system PS. However, there are limitations in the resolution of known sensors to carry out such measurements. As described above, the resolution may be limited by the number of pixels in the sensor and/or the available space for the sensor. For example, the number of pixels may be limited by sensor technology and/or cost for the sensor to be used. The space available for the sensor may be limited depending on the location of the sensor.

Thus, it is beneficial to provide an apparatus and method for measuring a radiation beam in a lithographic apparatus. Ideally, the apparatus and method of the present invention can be used to provide improved measurements in a lithographic apparatus.

The present invention relates to a lithographic apparatus, for example as described above. The lithographic apparatus may comprise some or all of the features above. The lithographic apparatus may not be limited to including all of the above described features.

The lithographic apparatus comprises a projection system having an optical axis and being configured to project a radiation beam. The projection system of the lithographic apparatus may be configured as described in the above examples or may be otherwise configured. Generally, the projection system is any system used to project a radiation beam. The radiation beam may be the same as the radiation beam B described above.

The optical axis may be understood to have a general meaning of a line along which there is some degree of rotational symmetry in the optical system, i.e. the projection system. The optical axis may not necessarily pass through a central axis of the projection system. The radiation beam projected by the projection system may be along the optical axis. Thus, the optical axis may be the axis along which the radiation beam is projected by the projection system.

The lithographic apparatus further comprises a measurement unit arranged to measure the radiation beam projected via the projection system. The measurement unit comprises an opening through which the radiation beam passes in use. The measurement unit further comprises a sensing surface extending transverse to the optical axis. The sensing surface is arranged to measure the radiation beam passing through the opening. The sensing surface may be positioned relative to the optical axis such that the radiation beam which passes through the opening is incident on the sensing surface. Thus, the sensing surface is downstream of the opening such that the radiation beam passes through the opening, and is then incident on the sensing surface.

The sensing surface being transverse to the optical axis means that the sensing surface extends across the optical axis. Thus, the sensing surface is not parallel to the optical axis. Furthermore, the sensing surface is positioned such that the optical axis passes through the sensing surface. For example, the sensing surface may be orthogonal to the optical axis. However, this is not necessary, and the sensing surface may be in some way slanted with respect to the optical axis, i.e. with an angle between the sensing surface and the optical axis of greater than 0° and less than 90°.

The lithographic apparatus is configured to move the sensing surface in a plane transverse to the optical axis between a plurality of measurement positions. Thus, the plane in which the sensing surface is moved is not parallel to the optical axis, i.e. not solely in the direction parallel to the optical axis. In other words at least a component of the movement of the sensing surface between the plurality of measurement is not parallel the optical axis, i.e. there is a component of the movement which is perpendicular to the optical axis and optionally, a component of the movement which is parallel to the optical axis. Furthermore, the plane is positioned such that the optical axis passes through the plane. It may be preferable that the plane in which the sensing surface is moved is orthogonal to the optical axis. This may allow measurements to be taken in a manner which is easier to process as the measurements would be taken at a set distance from the opening. However, this is not necessary, and the plane may be in some way slanted with respect to the optical axis, i.e. with an angle between the plane and the optical axis of greater than 0° and less than 90°.

As will be described in further detail below, the sensing surface may be moved to different measurement positions to measure the radiation beam incident on the sensing surface in that measurement position. The sensing surface may be moved in a variety of ways. The sensing surface may be moved relative to the radiation beam, i.e. along the optical axis as described above.

The radiation beam defines a view in said plane (in which the sensing surface is moved). This means that a cross-section through the radiation beam in the plane provides the view. The radiation beam can be measured by the sensing surface in the plane. As will be understood, the intensity of the radiation beam may vary across the view.

The measurement unit is configured such that the sensing surface captures, in each measurement position, a portion of the view smaller than 100% of the view. In other words, the sensing surface is smaller than 100% of the view in the plane in which the sensing surface is moved. So if a cross-section is taken of the radiation beam in the plane in which the sensing surface is moved, a cross-sectional area of the radiation beam (which is 100% of the view) will be larger than a cross-sectional area of the sensing surface. This means that only a portion of, and not the whole, radiation beam is incident on the sensing surface at any one time, i.e. when the sensing surface is in one measurement position. As described above, the sensing surface is moved to different measurement positions in the plane such that multiple measurements of the radiation beam can be made across the plane. 100% of the view may otherwise be referred to as the whole view.

Providing a measurement unit which is configured in this way is beneficial because higher resolution measurements can be made than using known sensors. In further detail, as the sensing surface is used to measure a smaller portion of the radiation beam than known sensors, it means that measurements of the radiation beam can be made with higher resolution using the same sensing surface (i.e. with the same number of pixels and sensing surface size). Alternatively, if such an improvement in resolution would not provide great benefit to the user, the user could replace present systems with the present invention and the same resolution measurements could be carried out using a smaller volume for the measurement unit. Alternatively, if such an improvement in resolution would not provide great benefit to the user, the user could replace present systems with the present invention and the same resolution measurements could be carried out using larger pixels, e.g. with a cheaper sensing surface, which would provide more accurate measurements due to decreased pixel cross talk and lower noise.

The sensing surface may be part of a sensor. The sensing surface may be substantially flat or may be curved. The sensing surface could be flat, but may be provided at an angle (which is not parallel or orthogonal) to the optical axis, i.e. the sensing surface may be slanted. The sensing surface may be of any appropriate shape. Below, figures are described which show the sensing surface as being square or rectangular. However, the sensing surface is not limited to a specific shape. The sensing surface is a part of the sensor which is capable of measuring the radiation beam. I.e. the part of the sensor on which the radiation beam would be incident for measuring the radiation beam. Various different types of sensing surface/sensor may be used. For example, the sensing surface may be part of a charge-coupled device (CCD) and/or a complementary metal-oxide semiconductor (CMOS) sensor. The sensor may otherwise be referred to as a detector, or sensing unit. Any sensor or detector that can be configured to capture light intensity can be used. The sensing surface may be provided by multiple cells and/or discrete sensing devices. For example, the sensing surface may be formed by a strip of light-sensitive devices.

As mentioned above, the lithographic apparatus is configured to move the sensing surface. Thus, the lithographic apparatus may be arranged to alter the position of the sensing surface, and in particular to move the sensing surface between the plurality of measurement positions. The sensing surface may thus obtain measurements of multiple portions of the radiation beam in the plane in which the sensing surface is moved. This is beneficial as it means that a larger portion of the radiation beam in the plane can be measured at the higher resolution.

The position of the sensing surface may be moved relative to the radiation beam. The lithographic apparatus may be configured to maintain the position of the radiation beam projected by the projection system in a substantially constant position when the sensing surface is configured to measure the radiation beam in the plurality of measurement positions. Thus, the position of the radiation beam may be kept substantially constant, and the position of the sensing surface may be altered. Movement of the sensing surface will be described in further detail below. In this way, the sensing surface can be used to measure different parts of the radiation beam in the plane in which the sensing surface is moved. The portion of the radiation beam being measured may be determined based on the position of the sensing surface at which the measurement is made.

The lithographic apparatus may comprise a support table as described above. The support table may be configured to support a substrate W, for example, the support table may be a substrate table WT as described above. The measurement unit may be provided on the support table. Thus, the measurement unit may be supported on a surface of the support table. The measurement unit may be formed as part of the support table.

The lithographic apparatus may be configured to move the sensing surface by moving the support table. The lithographic apparatus may be configured to move the sensing surface in a number of different ways. If the sensing surface (and measurement unit more generally) is supported by the support table, then movement of the support table may move the position of the sensing surface (and measurement unit). For example, the lithographic apparatus may comprise a positioner and a sensor configured to accurately move the support table, such as the second positioner PW and the position sensor IF. The positioner may optionally comprise a long-stroke module and a short-stroke module to accurately position the support table, and thus the sensing surface, as described above. If the sensing surface is provided on or as part of any other support, then similar components may be used to accurately position the support and/or sensing surface.

Additionally or alternatively, the position of the sensing surface may be controlled independently of the support on which the sensing surface is placed. Thus, the lithographic apparatus may be configured to move the sensing surface relative to the support. For example, as described further below, the lithographic apparatus may comprise an actuator configured to move the measurement unit. Additionally or alternatively, the sensing surface may be moved separately from other components of the measurement unit. For example, at least one actuator (not pictured) may be provided to move the sensing surface relative to other components of the measurement unit and/or the radiation beam.

Theoretically, the position of the sensing surface may be kept constant and the radiation beam may be moved. This would provide the same advantage because different parts of the view of the radiation beam in the plane may thus be measured.

Preferably, at least part of the portion of the view captured by the sensing surface in one measurement position does not overlap with the portion of the view captured by the sensing surface in any of the other measurement positions. In other words, the sensing surface may be used to measure at least one distinct unmeasured area of the radiation beam in the view at each measurement position. Thus, in each measurement position, the sensing surface may measure a part of the radiation beam not measured when the sensing surface is in any of the other measurement positions. This is beneficial as it means that a greater portion of the whole view can be measured by the sensing surface in different measurement positions because each measurement positions captures at least a new part of the view not measured in the other measurement positions. Reducing the overlap thus increases the angular resolution. Angular resolution could also be increased by increasing the number of openings.

Preferably, there may be some overlap between the portion of the view captured by the sensing surface in different measurement positions. More preferably, there is a selected amount of overlap of the view measured in adjacent measurement positions. Having a certain amount of overlap of the view measured when the sensing surface is in different measurement positions may be advantageous, because it may help increase accuracy by allowing the measurements taken in different measurement positions to be compared. Overlapping measurements can be used for correcting variation over time and increasing accuracy of the measurements. The amount of overlap can be controlled by controlling the movement of the sensing surface and/or by selecting the position of openings relative to one another (if multiple openings are provided and/or by selecting the position of the sensing surface relative to the opening(s).

Ideally, the sensing surface is moved to different measurement positions such that there is at least a portion of the view being measured which does not overlap, as well as a selected amount of overlap to ensure that accurate measurements are being made as described above. In other words, the sensing surface is moved to different measurement positions such that at most a portion of the view being measured—for example at most 10% or 50% of this view—overlaps with the portion or portions of the view captured by the sensing surface in any of the other measurement positions.

The lithographic apparatus may be configured to combine the portions of the view captured in the plurality of measurement positions. In this way, the lithographic apparatus can be used to combine measurements of various different portions of the radiation beam. Ideally, the lithographic apparatus may be configured to combine the portions to provide a measurement of 100% of the view in said plane. This can be beneficial in that a measurement can be taken across the whole of the radiation beam in the plane in which the sensing surface is moved. Because the sensing surface takes measurements which are not 100% of the view, this means that measurements of the radiation beam are smaller than the view which means that the resolution of the measurements is higher than if using a similar sensing surface to capture the whole view in one measurement position. This means that more accurate measurements across the whole of the radiation beam can be provided. In this way, improved measurements can be made while still using the same sensing surface as may have been used in known sensing devices.

The lithographic apparatus may comprise a processor configured to combine the portions of the view captured in the plurality of measurement positions. The processor may receive data representing the view captures by the sensing surface from the sensing surface. The data may be sent from the sensing surface to the processor via a network (i.e. wirelessly) or using wires. The processor may be any appropriate computing device/electronic circuit which can be used to receive and combine the data.

A distance between the opening and the sensing surface is such that an area of 100% of the view in said plane is larger than the sensing surface, i.e. an overall area of the sensing surface. In other words, the sensing surface may be positioned with respect to the opening such that the view of the radiation beam in said plane is larger than the sensing surface. There may be a minimum predetermined distance for a given size of opening and sensing surface. Thus, the distance may vary depending on at least these factors.

The sensing surface, i.e. the overall area of the sensing surface, may be less than or equal to approximately 70% of the area of 100% of the view. Thus, in any one of the measurement positions, the sensing surface may be used to measure less than or equal to approximately 70% of the radiation beam in the plane in which the sensing surface is moved, i.e. less than or equal to approximately 70% of the whole view. Alternatively, the area of the sensing surface may be smaller. For example, the sensing surface may be less than or equal to approximately 60% of the area of 100% of the view, or less than or equal to approximately 50% of the area of 100% of the view, or less than or equal to approximately 30% of the 100% of area of the view.

The opening may be provided in a variety of different configurations. The opening may simply be a hole through a plate as described later on, or a slit or a set of lines. The opening may be of any appropriate shape and size. If the opening is a slit, this means that the sensor surface can be moved along only one direction resulting in a kind of continuous or discontinuous scanner motion. The opening may optionally be a 1D or a 2D pattern and may preferably comprise a grating. The grating may be of any appropriate form. For example, the grating could be in a 1D pattern or in a 2D pattern, like a checkerboard pattern with a predetermined pitch.

The measurement unit may comprise a plate wherein the plate forms the opening. The plate may have any appropriate number of openings. For example, the plate may comprise a single opening or multiple openings, as will be described further. The plate may provide the opening by having a through hole, through which the radiation can pass. The plate may comprise some form of grating in the opening as mentioned above. The plate may be any element with any appropriate shape and thickness to form an opening through which the radiation beam can pass to the sensing surface.

Figure 2A:
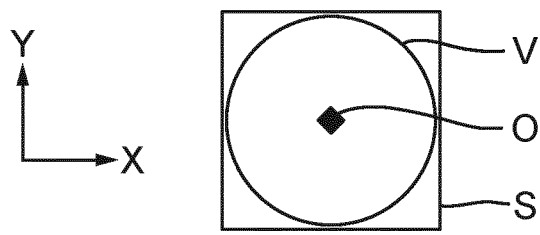
FIGS. 2A and 2B schematically depict a known measurement sensor.
Figure 2B:
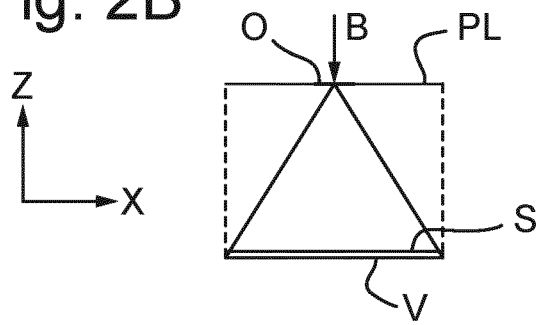

For comparison only as a side step, a sensor which might have previously been used in the prior art is depicted in FIGS. 2A and 2B. FIG. 2A shows a schematic drawing in an X-Y plane, which could also be considered as a plan view. FIG. 2B shows a schematic drawing in a Z-X plane, which could also be considered as a side view. As shown, the sensor includes a plate PL which forms opening O and a sensing surface S. The beam B passes through the opening O and forms a cone of radiation in the sensor. Although a cone of radiation is produced and shown here, this is for example only, and any shape of beam may be measured. The sensing surface S is used to measure the radiation beam. A view of the radiation beam B in the plane of the sensing surface S is smaller than the sensing surface. Therefore, in a single measurement position as shown in FIGS. 2A and 2B, the sensing surface S captures the whole view V, i.e. 100% of the view. So far the side step, now returning to the invention.

In an embodiment, the measurement unit comprises multiple openings through which the radiation beam passes in use and one of the openings is used per measurement position. This means that when the sensing surface is in each of the measurement positions, the radiation beam passes through one of the multiple openings and is incident on the sensing surface. Preferably, the multiple openings are in a fixed position relative to the sensing surface. Therefore, the sensing surface and the multiple openings do not move relative to one another. This embodiment is depicted in FIGS. 3A, 3B, 3C and 3D. These figures depict a measurement unit M which is configured such that a sensing surface S captures, in each measurement position, a portion of the view smaller than 100% of the view. The whole view V of the radiation beam B in the plane in which the sensing surface S is shown as being larger than the area of the sensing surface S.

Figure 3A:
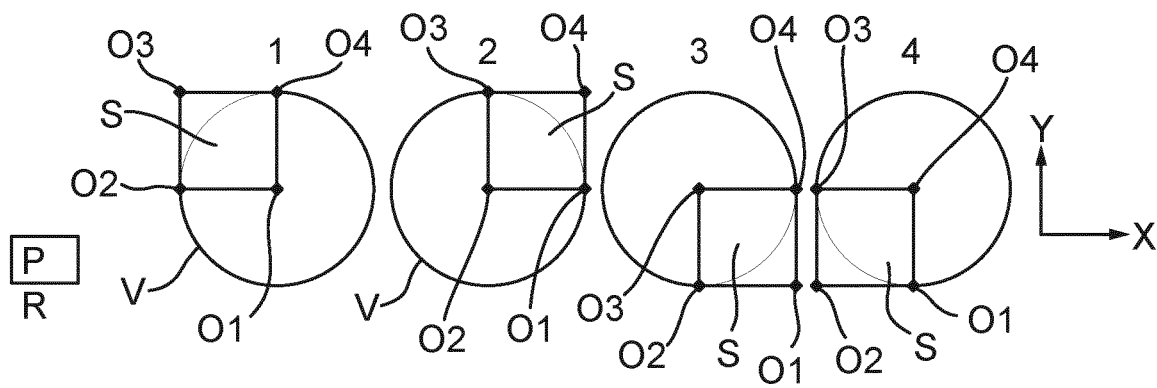
FIGS. 3A, 3B, 3C and 3D schematically depict an apparatus of an embodiment.
Figure 3B:
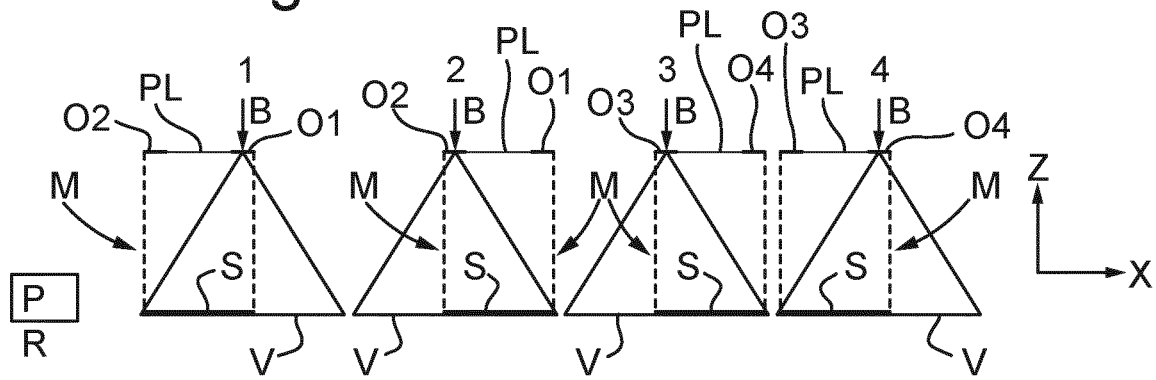
Figure 3C:
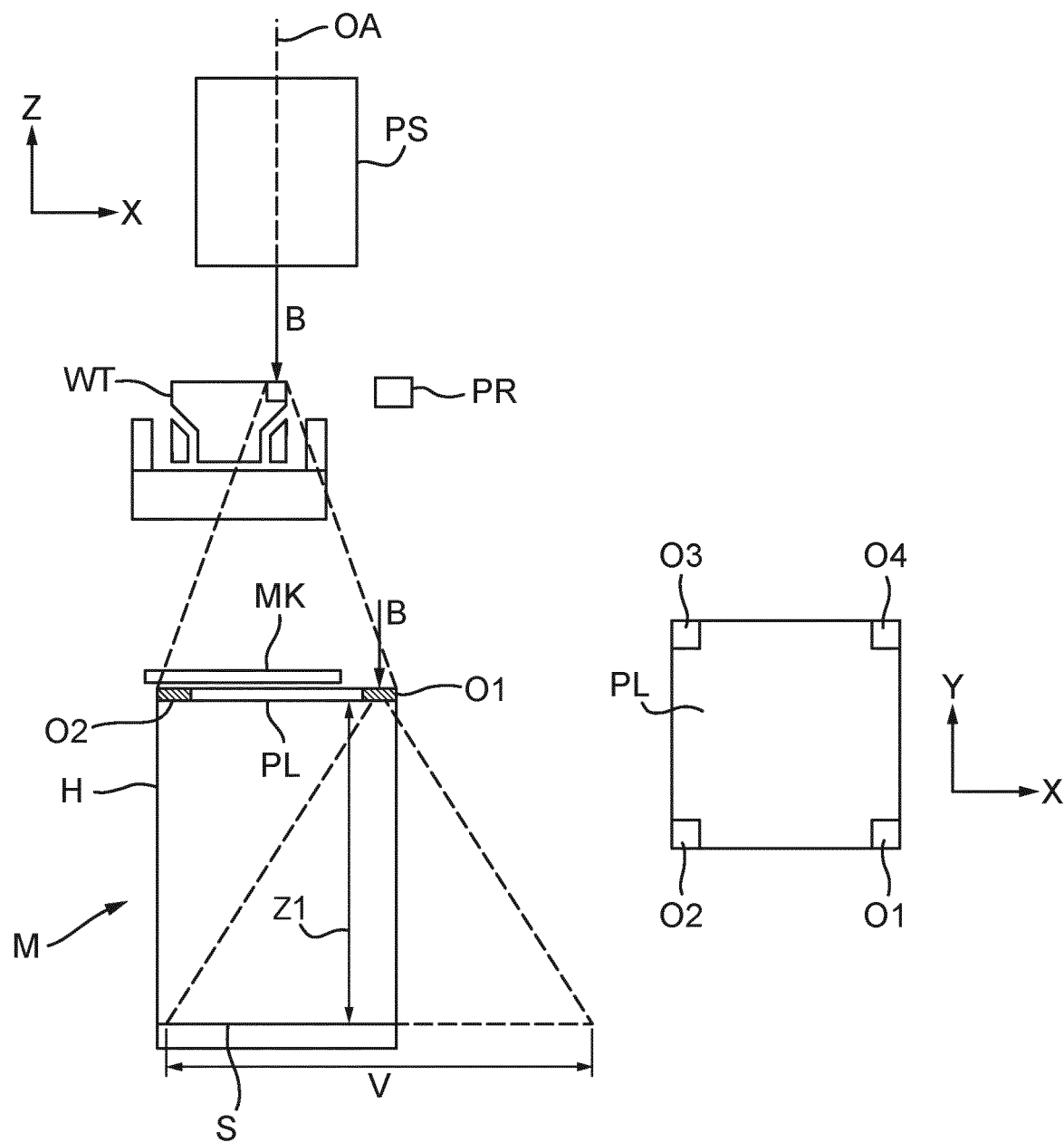
Figure 3D:
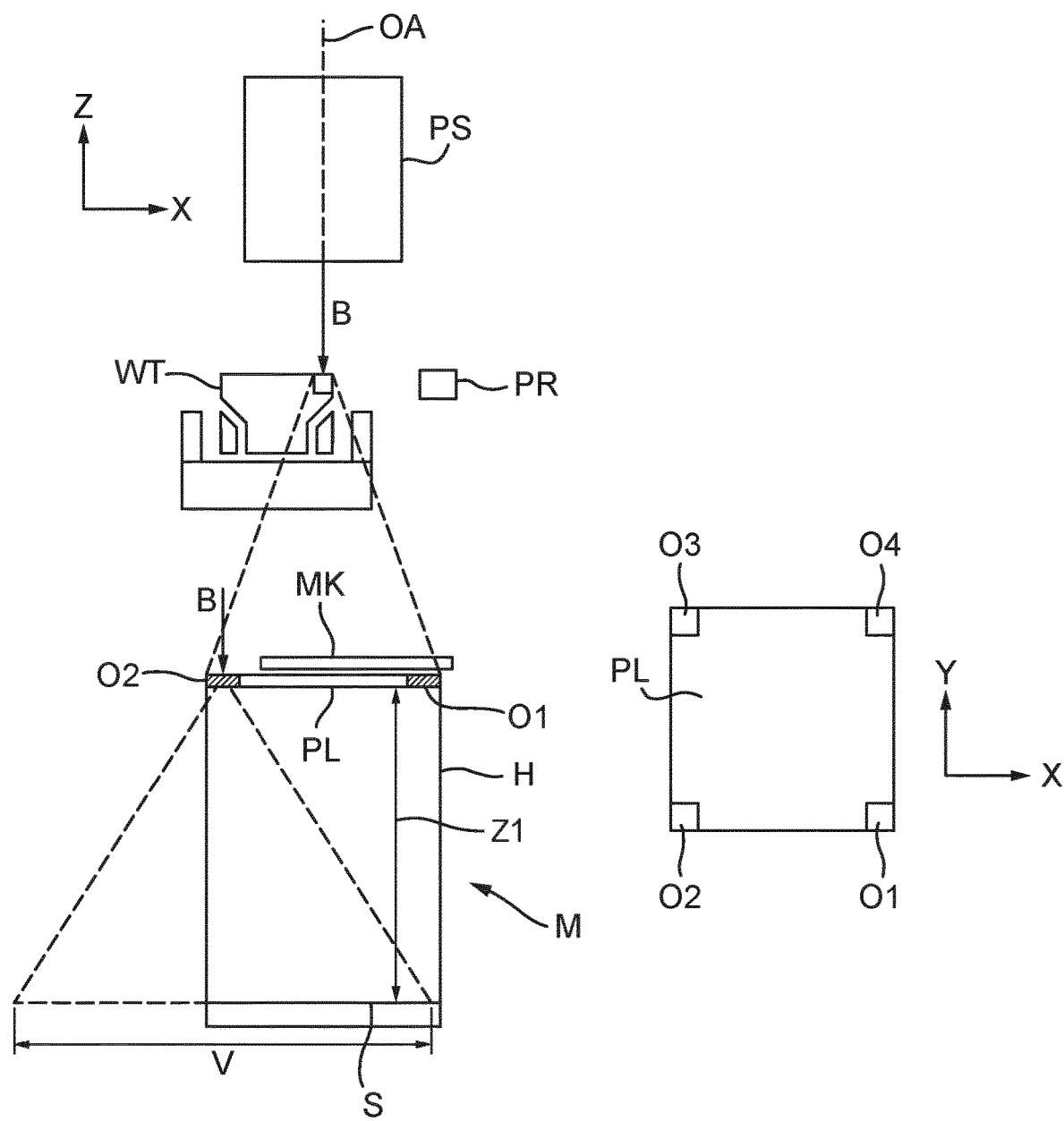

As described above, the lithographic apparatus may comprise projection system PS (as shown in FIGS. 3C and 3D). The radiation beam B is projected by the projection system PS and is incident on the sensing surface S. The sensing surface S is configured to measure a portion of the view which is smaller than 100% of the view in each measurement position. FIGS. 3A and 3B depict the measurement unit M, and more particularly the sensing surface S, being moved between a first measurement position 1, a second measurement position 2, a third measurement position 3 and a fourth measurement position 4. FIGS. 3C and 3D show the first measurement position 1 and the second measurement position 2 in further detail.

The measurement system M may comprise multiple openings O1, O2, O3, O4 as shown, through which the radiation beam passes in use. One of the multiple openings may be used per measurement position. The measurement system M may comprise a plate PL as described above, the plate PL comprising the multiple openings. As shown in these figures, four openings O1, O2, O3, O4 are depicted at a distance of Z1 from the sensing surface S. As shown, the four openings O1, O2, O3, O4 are in a plane parallel to the sensing surface S such that the distance Z1 from the sensing surface S to each of the multiple openings O1, O2, O3, O4 is the same. There may be any number of appropriate openings. The number of openings may vary and the distance from each opening to the sensing surface S may be different from other openings.

The multiple openings O1, O2, O3, O4 may be in a fixed position relative to the sensing surface S, for example, the plate PL comprising the openings may be in some way connected to the sensing surface S. The measurement unit M may comprise a housing H which supports the sensing surface S and the plate PL comprising the openings O1, O2, O3, O4. The sensing surface S and the plate PL may be attached to the housing H such that these components have fixed positions with respect to one another. In this embodiment, the openings O1, O2, O3, O4 are moved relative to the radiation beam B in the same way as the sensing surface S is moved relative to the radiation beam B. Although a housing H is depicted in these figures, the sensing surface S and openings O1, O2, O3, O4 may be provided as part of a support, such as a substrate table WT which may keep the openings O1, O2, O3, O4 and the sensing surface S in a fixed position relative to each other.

One of the multiple openings may be used per measurement position. Thus, the radiation beam B may pass through one of the multiple openings O1, O2, O3, O4 and be incident on the sensing surface S when a measurement is being made in one of the measurement positions. When the sensing surface S and openings O are moved relative to a radiation beam B, the radiation beam B may pass through a different one of the openings O and be incident on the sensing surface S for a measurement in a different measurement position. Thus, there may be one opening which corresponds to each measurement position.

As described above, the lithographic apparatus is configured to move the sensing surface S in a plane transverse to an optical axis OA of the projection system PS. This is shown by the change in position of the measurement unit M in the measurement positions 1-4 shown in FIGS. 3A and 3B. In the figures, for example only, the sensing surface S is moved in the X-Y plane, which is orthogonal to the optical axis OA. As indicated above, this is not a necessity.

The position of the sensing surface S (and in this example, of the whole measurement unit M), may be moved relative to the projection beam B such that different portions of the whole view V of the radiation beam B in the plane in which the sensing surface S is moved may be measured. In this example, there is little or no overlap between the measurement made by the sensing surface S in the first measurement position 1, the second measurement position 2, the third measurement position 3 and the further measurement position 4 as shown in FIG. 3A. As described above, it may be beneficial to have some overlap.

In this embodiment, the lithographic apparatus is configured to move the sensing surface S in said plane and relative to the radiation beam B projected by the projection system PS to obtain measurements at the plurality of measurement positions. The lithographic apparatus may be configured to maintain the position of the radiation beam B projected by the projection system PS in a substantially constant position for the measurements at a plurality of measurement positions.

In FIGS. 3A and 3B, there are four measurements positions shown from the left to the right. In the first measurement position 1 (the one on the left), the sensing surface S captures a portion of the view wherein the radiation beam has passed through the first opening O1. In the second measurement position 2, the sensing surface S captures a portion of the view wherein the radiation beam has passed through the second opening O2. In the third measurement position 3, the sensing surface S captures a portion of the view wherein the radiation beam has passed through the third opening O3. In the fourth measurement position 4, the sensing surface S captures a portion of the view wherein the radiation beam has passed through the fourth opening O4. The lithographic apparatus of this embodiment may be configured to move the sensing surface S relative to the radiation beam to each of the measurement positions (1-4) to obtain measurements of the radiation beam B via each one of the openings O1, O2, O3, O4. Thus, each of the multiple openings O1, O2, O3, O4 may correspond to a measurement position. In this embodiment also the multiple openings O1, O2, O3 and O4 may, associated to the moving of the sensor surface between the plurality of measurement positions, move relative to the radiation beam. The multiple openings may move simultaneously or non-simultaneously with the sensing surface. In addition or alternatively, the multiple of openings may move the same distance as the sensing surface or a distance different from the distance over which the sensing surface is moved.

The multiple openings may be arranged at a position fixed relative to each other. Alternatively the multiple openings may be arranged at positions movable relative to each other, or may be arranged to be group wise movable relative to one or more other groups of openings of the multiple of openings.

The multiple openings O1, O2, O3, O4 may be arranged such that in each measurement position, at least one opening is outside the radiation beam, i.e. outside 100% of the view V in plan. This means that the radiation beam should not pass through at least one opening outside of the whole view V. This may reduce noise from radiation passing through multiple openings for a specific measurement position. This is depicted in FIG. 3A, in which the third opening O3 is outside the radiation beam (and the whole view V in plan) in the first measurement position 1, the fourth opening O4 is outside the radiation beam (and the whole view V in plan) in the second measurement position 2, the first opening O1 is outside the radiation beam (and the whole view V in plan) in the third measurement position 3 and the second opening O2 is outside the radiation beam (and the whole view in plan) in the fourth measurement position 4.

Optionally, as shown in FIGS. 3C and 3D, the lithographic apparatus may comprise a mask MK configured to mask all openings except one of the multiple openings in each measurement position. This may prevent or reduce radiation from entering the measurement unit via the other openings during such measurements. This may be beneficial in reducing noise by ensuring that the radiation beam incident on the sensing surface has passed through only one of the openings. This reduces the likelihood of errors due to the multiple openings being provided and reduces noise. The mask MK could be made of any suitable material. The mask MK should be made of a material which can substantially prevent the transmission of radiation through the mask. Although the mask MK may ideally mask all except one of the openings, the mask MK may only be used to mask one or more of the openings, for example, an opening nearest to the opening being used in a particular measurement position. The position of the mask MK may be controlled using a form of actuator (not depicted).

As mentioned above, the opening may comprise a grating. In this embodiment, at least one of the multiple openings may comprise a grating. All of the openings may comprise a grating. The gratings may be identical. This may be beneficial in that comparison made by the measurements made by the different openings may be more easily made and/or manufacturing may be easier and thus, cheaper for identical gratings.

In any of the above embodiments, the sensing surface S may be offset in a plan view from the opening through which the radiation beam B passes in use. This means that a plan view, for example, in the X-Y view shown in FIG. 3A, the sensing surface S is not aligned with the opening through which the radiation beam passes in any of the measurement positions. In other words, a centre point of the sensing surface S may not be aligned with a centre point of the opening when a measurement is being made. For example, in the first measurement position 1, the sensing surface S is offset from the first opening O1 through which the radiation beam passes.

In another embodiment, the measurement unit may comprise only a single opening through which the radiation beam passes in use. In this embodiment, the lithographic apparatus may be configured, between measurements in each of the plurality of measurement positions, to maintain the position of the single opening relative to the radiation beam projected by the projection system. This embodiment is depicted in FIGS. 4A and 4B. As described above, the lithographic apparatus may be configured to move the sensing surface S in a plane transverse to the optical axis between a plurality of measurement positions. Five measurement positions are shown in FIGS. 4A and 4B. The lithographic apparatus may be configured to maintain the position of single opening O5 in a substantially constant position as indicated by the constant position between the measurement positions 1-5 shown in FIGS. 4A and 4B.

In this embodiment, a plate PL may be provided comprising only the single opening O5. In this embodiment, the sensing surface S is moved relative to other components of the measurement unit M. In each of the measurement positions, the sensing surface S is configured to measure a portion of the view of the radiation beam in a plane transverse to the optical axis in which the sensing surface S is moved, wherein the portion of the view is smaller than 100% of the view V. The position of the radiation beam B and the single opening O5 are maintained in a substantially constant position and the sensing surface S is moved to the different measurement positions 1-5. The sensing surface S then measures a different portion of the radiation beam B in each measurement position 1-5. There may be some overlap of the portion of the view measured in each of the measurement positions 1-5.

The lithographic apparatus may comprise an actuator A as depicted in FIG. 4B. The actuator A may be part of the measurement system M. The actuator A may be configured to move the sensing surface S between the plurality of measurement positions, for example as depicted in FIGS. 4A and 4B. The actuator A may be provided in any appropriate form. For example, the actuator A may comprise a moving part which supports the sensing surface S and is moved along tracks within the measurement unit M. The actuator A may comprise a roller system, similar to a conveyor belt to move the sensing surface S back and forth in the X direction as indicated in FIG. 4B. Any appropriate actuator which can be provided on a small enough scale to move the sensing surface S may be used.

The sensing surface S may be used to take measurements in any number of measurement positions in any of the embodiments. The sensing surface S may be moved in a stepping mode, in which the sensing mode is moved to a measurement position and a measurement is taken when the sensing surface S is substantially stationary. Alternatively, the sensing surface may be moved in a scanning mode, for example moving the sensing surface S and taking measurements during the movement of the sensing surface S. When only a single opening is provided, the sensing surface S may be continuously moved, preferably very slowly, so that measurements can be taken at specific timings to provide the measurements at different measurement positions, i.e. in a scanning mode.

As described above, the lithographic apparatus may comprise a processor configured to combine the portions of the view captured in the plurality of measurement positions. The processor PR is depicted in FIGS. 3A, 3B, 3C and 3D. The processor PR is not depicted in FIG. 4A or 4B but could also be provided with this embodiment. The processor PR may be situated wherever convenient. The processor PR may be formed as part of the substrate table WT.

The present invention also provides a method of measuring a radiation beam. The method may correspond to the above apparatus as will be described in further detail below. The definitions and description provided in relation to the apparatus may also apply to the method, but may not be repeated below for conciseness. Advantages described above in relation to the apparatus may equally apply to certain steps of the method.

Figure 5:
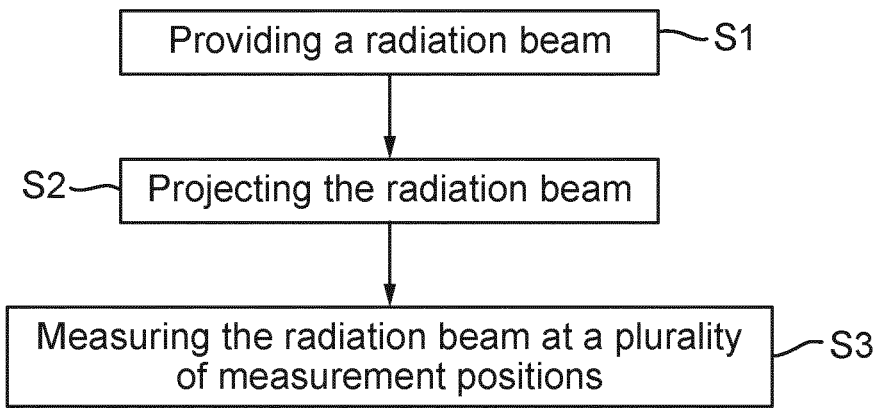
FIGS. 5 and 6 depict a method according to an embodiment.

The method is for measuring a radiation beam in a lithographic apparatus. The method may comprise using the lithographic apparatus as in any of the variations and/or embodiments as described above. The method is depicted in FIG. 5. The method comprises providing a radiation beam, as in step S1, projecting the radiation beam, as in step S2, and measuring the radiation beam, as in step S3.

The radiation beam B may be provided and/or projected as described above. For example, the radiation beam projected by the projection system may be along the optical axis. The apparatus described above may be used to provide and/or project the radiation beam B, or other configurations or apparatus may be used. Generally, the projection system PS is any system used to project a radiation beam B. The method includes projecting the radiation beam through an opening in a measurement system. The measurement system M may be as described in any of the above variations or embodiments.

The measuring step S3 includes measuring the radiation beam having passed through the opening, at a plurality of measurement positions, using a sensing surface of the measurement system. As described above, the sensing surface may extend transverse to the optical axis.

Measuring the radiation beam comprises moving the sensing surface in a plane transverse to the optical axis between the plurality of measurement positions. The plane in which the sensing surface is moved may be orthogonal to the optical axis. As described above, the radiation beam defines a view in said plane and the sensing surface captures, in each measurement position, a portion of the view smaller than 100% of the view.

Figure 6:
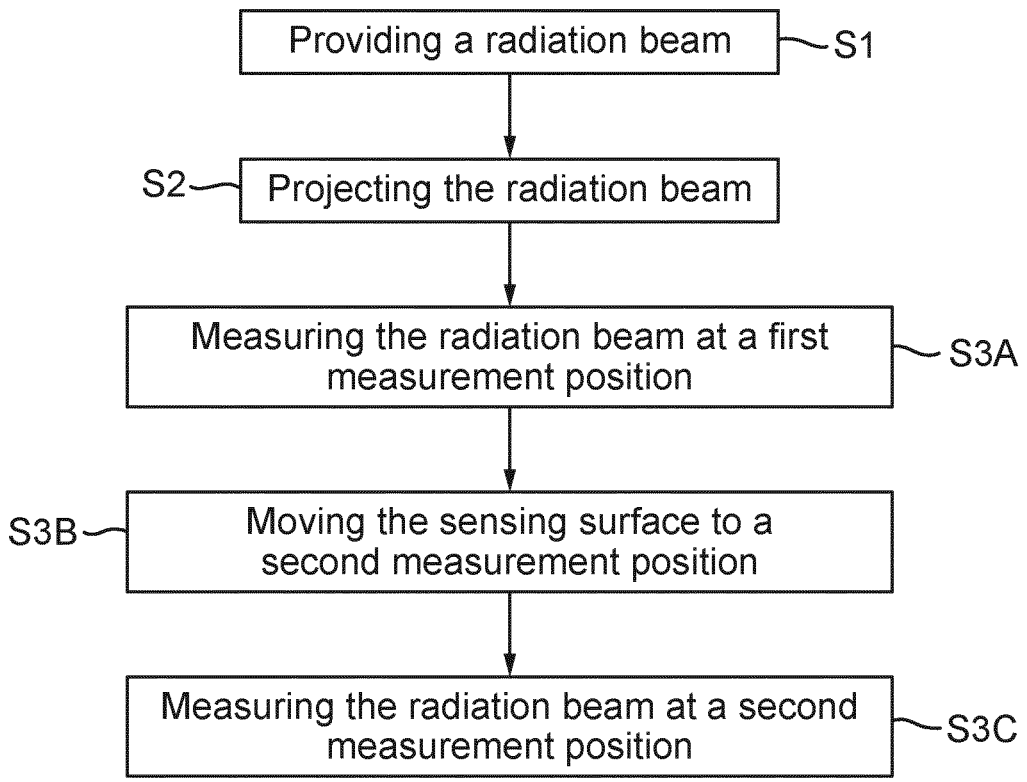

In further detail, the measuring step may be considered to have multiple sub steps shown in FIG. 6. As shown, the method may comprise measuring the radiation beam projected by the projection system at a first measurement position, as in step S3A, moving the sensing surface in a plane transverse to the optical axis to a second measurement position, as in step S3B, and measuring the radiation beam projected by the projection system at a second measurement position, as in step S3C. Additional moving steps may be included to move the sensing surface to other measurement positions at which additional measurements may be carried out.

The method includes moving the sensing surface such that measurements are carried out at the plurality of measurement positions. Thus, the method includes altering the position of the sensing surface, and in particular moving the sensing surface between the plurality of measurement positions. The sensing surface may thus obtain measurements of multiple portions of the radiation beam in the plane in which the sensing surface is moved. The sensing surface may be moved in the plane in a variety of ways as described above.

The measuring step may comprise maintaining the position of the radiation beam projected by the projection system in a substantially constant position when the measurements in the plurality of measurement positions are being made by the sensing surface. Thus, the position of the radiation beam may be kept substantially constant, and the position of the sensing surface may be altered. This means that the radiation beam may be kept in a substantially constant position relative to the moving sensing surface. In this way, the sensing surface can be used to measure different parts of the radiation beam in the plane in which the sensing surface is moved. The portion of the radiation beam being measured may be determined based on the position of the sensing surface at which the measurement is made.

Preferably, at least part of the portion of the view captured by the sensing surface in one measurement position does not overlap with the portion of the view captured by the sensing surface in any of the other measurement positions. As described, it is beneficial that there is at least a part which does not overlap. There may also be an overlap, which may advantageously improve accuracy of the measurements as described above.

The opening may be provided in a variety of different configurations as described above. The method may comprise providing a grating in the opening as described. The method may comprise providing any appropriate number of openings. As in the examples described for the apparatus, the method may include the use of a single opening or multiple openings (including the above described example including four openings). The measurement system may comprise a plate forming the openings as above.

The method may further comprise providing a support table configured to support the measurement unit. The support table may be as described above. As described, the measurement unit may be supported on a surface of the support table WT or formed as part of the support table WT.

The method may further comprise a step of combining the portions of the view captured in the plurality of measurement positions. Ideally, the method includes combining the portions to provide a measurement of 100% of the view. As described above, this means that improved measurements can be made while still using the same sensing surface as may have been used in known sensing devices.

Preferably, a distance between the opening and the sensing surface is such that an area of 100% of the view in said plane is larger than the sensing surface, i.e. an overall area of the sensing surface. In other words, the sensing surface may be positioned with respect to the opening such that the view of the radiation beam in said plane is larger than the sensing surface. There may be a minimum predetermined distance for a given size of opening and sensing surface. Thus, the distance may vary depending on at least these factors.

The sensing surface, i.e. the overall area of the sensing surface, may be less than or equal to approximately 70% of the area of 100% of the view. Thus, in any one of the measurement positions, the sensing surface may be used to measure less than or equal to approximately 70% of the radiation beam in the plane in which the sensing surface is moved, i.e. less than or equal to approximately 70% of the whole view. Alternatively, the area of the sensing surface may be smaller. For example, the sensing surface may be less than or equal to approximately 60% of the area of 100% of the view, or less than or equal to approximately 50% of the area of 100% of the view, or less than or equal to approximately 30% of the 100% of area of the view.

In an embodiment, the measurement unit comprises multiple openings through which the radiation beam passes in use. One of the multiple openings is used per measurement position. Thus, the radiation beam may pass through one of the openings and be incident on the sensing surface when a measurement is being made in a measurement position. In this embodiment, the method further comprises, between measurements in each of the plurality of measurement positions, moving the multiple openings and the sensing surface relative to the radiation beam. When the sensing surface and openings are moved relative to a radiation beam, the radiation beam may pass through a different one of the openings and be incident on the sensing surface for a measurement in a different measurement position. Thus, there may be one opening which corresponds to each measurement position. Optionally, the position of the multiple openings relative to the sensing surface is maintained when moving the multiple openings and the sensing surface relative to the radiation beam.

In this embodiment, the radiation beam may be measured at a first measurement position as in S3A of FIG. 6. This may correspond, for example, to taking a measurement in the first measurement position in FIGS. 3A, 3B and 3C. Thus, for example, the first measurement may be taken using the first opening O1. The method may then include the step of moving the sensing surface in the plane to another measurement position as in step S3B of FIG. 6. For example, this may correspond to moving the sensing surface and openings O1, O2, O3 and O4 (relative to the radiation beam) to the second measurement position in FIGS. 3A and 3B. The radiation beam may then be measured at a second measurement position as in S3C of FIG. 6. This may correspond, for example, to taking a measurement in the second measurement position in FIGS. 3A, 3B and 3D. Thus, for example, the second measurement may be taken using the second opening O2.

The multiple openings may be arranged such that in each measurement position, at least one opening is outside the radiation beam, i.e. outside 100% of the view in plan. As above, this may reduce noise from radiation passing through multiple openings for a specific measurement position.

The method may further comprise masking at least one of the openings, or preferably, all of the multiple openings except one in each measurement position. As described above, this may be beneficial in reducing noise. The masking may be carried out using mask MK.

The method may further comprise providing a grating in at least one of the multiple openings, or preferably identical gratings for the multiple openings.

In another embodiment, the measurement unit comprises only a single opening through which the radiation beam passes in use. The method further comprises, between measurements in each of the plurality of measurement positions, maintaining the position of the single opening relative to the radiation beam projected by the projection system. In this embodiment, the sensing surface is thus moved relative to other components of the measurement unit between measurements of the multiple portions of the radiation beam.

As shown in FIGS. 4A and 4B, the position of the radiation beam B and the opening O5 are maintained in a substantially constant position and the sensing surface S is moved to another measurement position relative to the radiation beam and opening O5. Thus, the sensing surface measures a different portion of the radiation beam when the sensing surface is moved.

In this embodiment, the radiation beam may be measured at a first measurement position as in S3A of FIG. 6. This may correspond, for example, to taking a measurement in the first measurement position in FIGS. 4A and 4B, wherein the radiation beam has passed through opening O5. The method may then include the step of moving the sensing surface in the plane to another measurement position as in step S3B of FIG. 6. For example, this may correspond to moving the sensing surface to the second measurement position in FIGS. 4A and 4B. The radiation beam may then be measured at a second measurement position as in step S3C of FIG. 6. This may correspond, for example, to taking a measurement in the second measurement position in FIGS. 4A and 4B, wherein the radiation beam has passed through opening O5.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tool 1s. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

Preceding and/or alternative and/or supplemental embodiments of this invention may be represented as elaborated in the following clauses:

1. A lithographic apparatus comprising:
    a projection system having an optical axis and configured to project a radiation beam; and
    a measurement unit arranged to measure the radiation beam projected by the projection system, the measurement unit comprising:
    an opening through which the radiation beam passes in use; and
    a sensing surface extending transverse to the optical axis and arranged to measure the radiation beam passing through the opening,
    wherein the lithographic apparatus is configured to move the sensing surface in a plane transverse to the optical axis between a plurality of measurement positions,
    wherein the radiation beam defines a view in said plane, and
    wherein the measurement unit is configured such that the sensing surface captures, in each measurement position, a portion of the view smaller than 100% of the view.
2. The lithographic apparatus of clause 1, wherein the lithographic apparatus is configured to maintain the position of the radiation beam projected by the projection system in a substantially constant position when the sensing surface is configured to measure the radiation beam in the plurality of measurement positions.
3. The lithographic apparatus of clause 1 or 2, wherein at least part of the portion of the view captured by the sensing surface in one measurement position does not overlap with the portion of the view captured by the sensing surface in any of the other measurement positions.
4. The lithographic apparatus of any preceding clause, wherein the opening comprises a grating.
5. The lithographic apparatus of any preceding clause, wherein the measurement unit is provided on a support table.
6. The lithographic apparatus of any preceding clause, wherein the radiation beam projected by the projection system is along the optical axis and the plane in which the sensing surface is moved is orthogonal to the optical axis.
7. The lithographic apparatus of any preceding clause, wherein the lithographic apparatus is configured to combine the portions of the view captured in the plurality of measurement positions to provide a measurement of 100% of the view in said plane.
8. The lithographic apparatus of any preceding clause, wherein a distance between the opening and the sensing surface is such that an area of 100% of the view in said plane is larger than the sensing surface.
9. The lithographic apparatus of clause 8, wherein the sensing surface is less than or equal to approximately 70% of the area of 100% of the view in said plane, or less than or equal to approximately 60% of the area of 100% of the view in said plane, or less than or equal to approximately 50% of the area of 100% of the view in said plane, or less than or equal to approximately 30% of the area of 100% of the view in said plane.
10. The lithographic apparatus of any preceding clause, wherein the measurement unit comprises multiple openings through which the radiation beam passes in use and one of the openings is used per measurement position, and wherein the lithographic apparatus is configured to move, associated to the moving of the sensor surface between the plurality of measurement positions, the multiple openings transverse to the optical axis.
11. The lithographic apparatus of clause 10, wherein the multiple openings are in a fixed position relative to the sensing surface.
12. The lithographic apparatus of clause 10 or 11, wherein the multiple openings are arranged such that in each measurement position, at least one opening is outside the radiation beam.
13. The lithographic apparatus of any one of clauses 10 to 12, wherein the lithographic apparatus comprises a mask configured to mask all openings except one of the multiple openings in each measurement position.
14. The lithographic apparatus of any one of clauses 10 to 13, wherein the multiple openings comprise identical gratings.
15. The lithographic apparatus of any one of clauses 1 to 9, wherein the measurement unit comprises only a single opening through which the radiation beam passes in use, and the lithographic apparatus is configured, between measurements in each of the plurality of measurement positions, to maintain the position of the single opening relative to the radiation beam projected by the projection system.

16. A method of measuring a radiation beam in a lithographic apparatus, the method comprising:
   providing a radiation beam;
   projecting the radiation beam, through an opening in a measurement system, using a projection system having an optical axis; and
   measuring the radiation beam having passed through the opening, at a plurality of measurement positions, using a sensing surface of the measurement system, the sensing surface extending transverse to the optical axis;
   wherein measuring the radiation beam comprises moving the sensing surface in a plane transverse to the optical axis between the plurality of measurement positions,
   wherein the radiation beam defines a view in said plane, and
   wherein the sensing surface captures, in each measurement position, a portion of the view smaller than 100% of the view.
17. The method of clause 16, wherein the measuring comprises maintaining the position of the radiation beam projected by the projection system in a substantially constant position when the measurements in the plurality of measurement positions are being made by the sensing surface.
18. The method of clause 16 or 17, wherein at least part of the portion of the view captured by the sensing surface in one measurement position does not overlap with the portion of the view captured by the sensing surface in any of the other measurement positions.
19. The method of any one of clauses 16 to 18, further comprising a 1D or 2D pattern, such as a grating, in the opening.
20. The method of any one of clauses 16 to 19, further comprising providing a support table, wherein the measurement unit is provided on the support table.
21. The method of any one of clauses 16 to 20, wherein the radiation beam projected by the projection system is along the optical axis and the plane in which the sensing surface is moved is orthogonal to the optical axis.
22. The method of any one of clauses 16 to 21, further comprising a step of combining the portions of the view captured in the plurality of measurement positions to provide a measurement of 100% of the view in said plane.
23. The method of any one of clauses 16 to 22, wherein a distance between the opening and the sensing surface is such that an area of 100% of the view in said plane is larger than the sensing surface.
24. The method of clause 23, wherein the sensing surface is less than or equal to approximately 70% of the area of 100% of the view, or less than or equal to approximately 60% of the area of 100% of the view, or less than or equal to approximately 50% of the area of 100% of the view, or less than or equal to approximately 30% of the area of 100% of the view.
25. The method of any one of clauses 16 to 24, wherein the measurement unit comprises multiple openings through which the radiation beam passes in use and one of the multiple openings is used per measurement position, and wherein the method further comprises, between measurements in each of the plurality of measurement positions, moving the multiple openings and the sensing surface relative to the radiation beam.
26. The method according to clause 25, wherein the position of the multiple openings relative to the sensing surface is maintained when moving the multiple openings and the sensing surface relative to the radiation beam.
27. The method of clause 25 or 26, wherein the multiple openings are arranged such that in each measurement position, at least one opening is outside the radiation beam.
28. The method of any one of clauses 25 to 27, further comprising masking all openings except one of the multiple openings in each measurement position.
29. The method of any one of clauses 25 to 28, wherein the multiple openings comprise identical gratings.
30. The method of any one of clauses 16 to 24, wherein the measurement unit comprises only a single opening through which the radiation beam passes in use, and the method further comprises, between measurements in each of the plurality of measurement positions, maintaining the position of the single opening relative to the radiation beam projected by the projection system.

The invention claimed is:

1. A sensing apparatus for a lithographic apparatus, the sensing apparatus comprising:
   a measurement unit arranged to measure a radiation beam projected by a projection system of the lithographic apparatus, the projection system having an optical axis and the measurement unit comprising:
   an opening through which the radiation beam passes in use; and
   a sensing surface arranged to extend transverse to the optical axis and arranged to measure the radiation beam passing through the opening,
   wherein the sensing surface is movable in a plane transverse to the optical axis to a plurality of measurement positions,
   wherein the radiation beam defines a view in the plane, and
   wherein the measurement unit is configured such that the sensing surface captures, in each measurement position, a portion of the view smaller than 100% of the view.
2. The sensing apparatus of claim 1, configured to maintain the position of the radiation beam projected by the projection system in a substantially constant position when the sensing surface is configured to measure the radiation beam in the plurality of measurement positions.
3. The sensing apparatus of claim 1, wherein at least part of the portion of the view captured by the sensing surface in one measurement position does not overlap with the portion of the view captured by the sensing surface in any of the other measurement positions.
4. The sensing apparatus of claim 1, wherein the opening has a 1D or 2D pattern.
5. The sensing apparatus of claim 1, wherein the measurement unit is provided on a support table.
6. The sensing apparatus of claim 1, wherein the radiation beam projected by the projection system is along the optical axis and the plane in which the sensing surface is moved is orthogonal to the optical axis.
7. The sensing apparatus of claim 1, configured to combine the portions of the view captured in the plurality of measurement positions to provide a measurement of 100% of the view in the plane.
8. The sensing apparatus of claim 1, wherein a distance between the opening and the sensing surface is such that an area of 100% of the view in the plane is larger than the sensing surface.

9. The sensing apparatus of claim 8, wherein the sensing surface is less than or equal to approximately 70% of the area of 100% of the view in the plane.

10. The sensing apparatus of claim 1, wherein the measurement unit comprises multiple openings through which the radiation beam passes in use and one of the openings is used per measurement position, and the sensing apparatus is configured to move, associated to the moving of the sensor surface to the plurality of measurement positions, the multiple openings transverse to the optical axis.

11. The sensing apparatus of claim 10, wherein the multiple openings are in a fixed position relative to the sensing surface.

12. The sensing apparatus of claim 10, wherein the multiple openings are arranged such that in each measurement position, at least one opening is outside the radiation beam.

13. The sensing apparatus of claim 10, further comprising a mask configured to mask all openings except one of the multiple openings in each measurement position.

14. The sensing apparatus of claim 10, wherein the multiple openings comprise identical gratings.

15. The sensing apparatus of claim 1, wherein the measurement unit comprises only a single opening through which the radiation beam passes in use, and the sensing apparatus is configured, between measurements in each of the plurality of measurement positions, to maintain the position of the single opening relative to the radiation beam projected by the projection system.

16. A lithographic apparatus comprising the sensing apparatus of claim 1.

17. A method comprising:
measuring a radiation beam projected using a projection system having an optical axis and having passed through an opening in a measurement system, at a plurality of measurement positions, using a sensing surface of the measurement system, the sensing surface extending transverse to the optical axis,
wherein measuring the radiation beam comprises moving the sensing surface in a plane transverse to the optical axis to the plurality of measurement positions,
wherein the radiation beam defines a view in the plane, and
wherein the sensing surface captures, in each measurement position, a portion of the view smaller than 100% of the view.

18. The method of claim 17, wherein the measuring comprises maintaining the position of the radiation beam projected by the projection system in a substantially constant position when the measurements in the plurality of measurement positions are being made by the sensing surface.

19. The method of claim 17, wherein at least part of the portion of the view captured by the sensing surface in one measurement position does not overlap with the portion of the view captured by the sensing surface in any of the other measurement positions.

20. The method of claim 17, further comprising combining the portions of the view captured in the plurality of measurement positions to provide a measurement of 100% of the view in the plane.

* * * * *